United States Patent

Dona et al.

Patent Number: 5,898,243
Date of Patent: Apr. 27, 1999

[54] DISPLACEMENT DEVICE WITH A MODULAR SYSTEM OF DISPLACEMENT UNITS

[75] Inventors: Marinus J. J. Dona; Jadranko Dovic; Jacobus S. Van Galen, all of Eindhoven, Netherlands

[73] Assignee: U.S. Philips Corporation, New York, N.Y.

[21] Appl. No.: 08/968,373

[22] Filed: Nov. 12, 1997

[30] Foreign Application Priority Data

Dec. 2, 1996 [EP] European Pat. Off. .............. 96203405

[51] Int. Cl.⁶ .................................................. H01L 41/09
[52] U.S. Cl. .............................. 310/12; 310/26; 310/317; 310/14
[58] Field of Search ............................ 310/12, 26, 317, 310/13, 14

[56] References Cited

U.S. PATENT DOCUMENTS 5,097,161  3/1992  Nashiki et al. ............................ 310/12
5,281,875  1/1994  Kiesewetter et al. ...................... 310/26
5,568,032  10/1996  Wakui ...................................... 318/632

FOREIGN PATENT DOCUMENTS 0592030  4/1994  European Pat. Off. .

Primary Examiner—Nestor Ramirez
Assistant Examiner—Judson H. Jones
Attorney, Agent, or Firm—F. Brice Faller

[57] ABSTRACT

A displacement device with a first part (1) and a second part (3) which are mutually displaceable in a displacement direction. The first part (1) comprises a number of contact bodies (7) which are pressed against the second part (3) against a pretensioning force which is present between the first part (1) and the second part (3). The contact bodies (7) are movable stepwise relative to the first part (1) and are also displaceable perpendicularly to the displacement direction. A stepwise movement of the contact bodies (7) causes the first part (1) and the second part (3) to be displaced relative to one another in the displacement direction under the influence of a friction force present between the contact bodies (7) and the second part (3), while the first part (1) and the second part (3) are supported in an accurate position relative to one another perpendicular to the displacement direction through a displacement of the contact bodies (7) perpendicular to the displacement direction. The contact bodies (7) thus have a dual function.

In a special embodiment, the contact bodies (7) have a spherical contact surface (23), the stepwise movement of the contact bodies (7) being a pure rolling motion of the spherical contact surface (23) over the second part (3).

The displacement device according to the invention is used in an X-Y table provided with an object table (99) which is displaceable relative to a base (95) parallel to an X-direction and parallel to a Y-direction which is perpendicular to the X-direction by means of the displacement device.

The displacement device according to the invention is further used in a spindle device provided with a shaft (121) which is rotatable in a bearing bush (117) and is displaceable in an axial direction relative to the bearing bush (117) by means of the displacement device.

19 Claims, 6 Drawing Sheets

DISPLACEMENT DEVICE WITH A MODULAR SYSTEM OF DISPLACEMENT UNITS

BACKGROUND OF THE INVENTION

The invention relates to a displacement device provided with a first part comprising at least two contact bodies which can be pressed against a second part and are movable stepwise relative to the first part by means of an actuator such that the first and the second part are displaceable relative to one another in a displacement direction under the influence of a friction force present between the contact bodies and the second part.

The invention also relates to a displacement unit suitable for use in a displacement device according to the invention.

A displacement device of the kind mentioned in the opening paragraph is known from EP-A-0 592 030. The first part in this known displacement device comprises a holder, and the second part comprises a shaft which is displaceable relative to the holder in an axial direction. The contact bodies of the first part each comprise a clamping member which can be clamped against the shaft. The first part further comprises a transport member which is fastened to the holder and by means of which a distance present in axial direction between the clamping members can be changed. The shaft is displaceable stepwise in the axial direction in accordance with a displacement cycle by means of the clamping members and the transport member. A first one of the two clamping members is clamped against the shaft at the start of a displacement cycle. Then the distance between the clamping members is increased by means of the transport member, so that the shaft is displaced in axial direction by the first clamping member. Subsequently, the second clamping member is clamped against the shaft, and the first clamping member is deactivated. The distance between the clamping members is reduced again now by means of the transport member, so that the shaft is displaced farther in axial direction by the second clamping member. Finally, the first clamping member is clamped against the shaft again, while the second clamping member is deactivated, whereupon the displacement cycle is repeated. The clamping members and the transport member are manufactured from piezoelectric material, so that very accurate displacements of the shaft relative to the holder in the axial direction are achieved.

A disadvantage of the known displacement device is that a position in which the shaft is present relative to the holder, as seen perpendicular to the displacement direction, is not accurately defined. The shaft is supported by the clamping members perpendicularly to the displacement direction. The positions of the clamping members relative to the holder perpendicular to the displacement direction, however, are dependent on inter alia the diameter of the shaft and are influenced by deviations of the shaft diameter in the displacement direction and by local deviations in the shaft surface. The known displacement device thus does not have an accurate bearing support function, with the shaft occupying an accurately defined position in a direction perpendicular to the displacement direction. This disadvantage renders the known displacement device unsuitable for a large number of applications.

SUMMARY OF THE INVENTION

It is an object of the invention to provide a displacement device which has, in addition to a dis also an accurate bearing support function in a direction perpendicular to the displacement direction, while at the same time a number of components required for the bearing support function is limited.

The invention is for this purpose characterized in that the first and the second part are pretensioned relative to one another perpendicularly to the displacement direction, while the contact bodies are displaceable relative to the first part perpendicularly to the displacement direction, and a position of the first and of the second part relative to one another perpendicular to the displacement direction is measurable by means of a sensor which forms part of a feedback control by means of which displacements of the contact bodies perpendicular to the displacement direction are controllable. The contact bodies of the first part have a dual function. Since the contact bodies are movable stepwise relative to the first part, the first part and the second part are displaceable relative to one another in the displacement direction. Since the contact bodies are furthermore displaceable relative to the first part perpendicularly to the displacement direction and the displacements of the contact bodies perpendicular to the displacement direction are controllable by means of the feedback control, the first part and the second part can be positioned relative to one another in an accurate manner perpendicularly to the displacement direction, so that the parts which are mutually displaceable in the displacement direction are at the same time mutually accurately supported in a direction perpendicular to the displacement direction. The fact that the contact bodies thus have a dual function limits the number of components required for the bearing support function.

A special embodiment of a displacement device according to the invention is characterized in that the contact bodies each form part of a separate displacement unit which is provided with a separate actuator system for the stepwise movement of the relevant contact body and for the displacement of the relevant contact body perpendicular to the displacement direction. The use of the separate displacement units provides for a modular construction of the displacement device. A simple and effective construction of the displacement device is achieved thereby, such that a number of contact bodies as determined in the design phase of the displacement device can be achieved in the displacement device in a simple and effective manner.

A further embodiment of a displacement device according to the invention is characterized in that the displacement device is provided with at least three displacement units, while the contact bodies are each provided with a contact surface which comprises at least part of a surface of an imaginary circular cylinder, and the displacement units each comprise at least two linear actuators which can be activated in a direction perpendicular to the displacement direction. In this further embodiment, the displacement direction is perpendicular to the centerline of the cylindrical contact surfaces of the contact bodies, the three contact surfaces being preferably positioned parallel to and next to one another. The mutual displacement and the bearing support of the two parts take place in that at least two of the three contact bodies of the first part are in contact with the second part, while the contact bodies perform a rotational movement through a limited angle about their centerlines.

When the rotational movement of a contact body has ended, the relevant contact body is detached from the second part and rotated back in opposite direction to the starting point of the rotational movement, during which the mutual displacement and support of the two parts is continued by the other contact bodies. A displacement of a contact body perpendicular to the displacement direction is achieved in that the two linear actuators of the relevant displacement unit are activated in the same direction, whereas the rotational movement of a contact body is achieved in that the two linear actuators are activated in opposite directions.

A yet further embodiment of a displacement device according to the invention is characterized in that the contact bodies are each fastened to the corresponding displacement unit by means of a membrane which extends parallel to the displacement direction in an imaginary plane which passes through the centerline of the circular cylinder.

The use of membranes prevents the contact bodies from being displaceable relative to the displacement units parallel to the displacement direction and parallel to the centerline of the contact surface, so that mechanical loads on the linear actuators in these directions are prevented.

A special embodiment of a displacement device is provided with at least three displacement units, while the contact bodies are each provided with a contact surface which comprises at least a portion of a surface of an imaginary sphere, and the displacement units each comprise at least three linear actuators which can be activated perpendicularly to the displacement direction. The fact that the displacement units are each provided with a spherical contact surface and three linear actuators means that the two parts of the displacement device are displaceable in two displacement directions which are perpendicular to one another. The use of the three linear actuators in fact renders the contact bodies rotatable about two mutually perpendicular centerlines of the spherical contact surface. The mutual displacement and the bearing support of the two parts again take place in this embodiment in that at least two of the three contact bodies of the first part are in contact with the second part, while the contact bodies perform a rotational movement through a limited angle about a centerline of the spherical contact surfaces. When the rotational movement of a contact body has ended, the relevant contact body is detached from the second part and rotated in opposite direction back to the starting point of the rotational movement, during which the mutual displacement and bearing support of the two parts is continued by the other contact bodies.

A further embodiment of a displacement device according to the invention is characterized in that the contact bodies are each fastened to the relevant displacement unit by means of an annular membrane which extends parallel to the displacement direction, the center of the membrane coinciding substantially with the center of the sphere. The use of membranes prevents, also in this embodiment, the contact bodies from being displaceable relative to the displacement units parallel to the displacement directions, so that mechanical loads on the linear actuators in these directions are prevented.

A yet further embodiment of a displacement device according to the invention is characterized in that the displacement units are each provided with four linear actuators which can be actuated perpendicularly to the displacement direction and are mutually positioned in a square. The spherical contact bodies in this embodiment are each rotatable about two mutually perpendicular centerlines of the spherical contact surface in that a first pair of actuators arranged next to one another and the other pair of actuators arranged next to one another are activated in opposite directions, whereas a displacement of a contact body perpendicular to the displacement directions is achieved by activating the four actuators in the same direction. The required movements of the contact bodies are achieved by means of a simple control of the actuators in this manner.

A special embodiment of a displacement device is provided with at least two displacement units which are each provided with a first pair of contact surfaces interconnected by a first bridge and a second pair of contact surfaces interconnected by a second bridge, wherein the first and the second bridge are positioned with a mutual interspacing, seen parallel to the displacement direction, and are interconnected by a bending actuator which is bendable about a bending axis which extends perpendicularly to the displacement direction and by a third bridge which is connected to the first and the second bridge via two elastic hinges extending parallel to the bending axis, the contact surfaces of each displacement unit being mutually positioned in a quadrangular arrangement and being each displaceable parallel to the bending axis by means of a separate linear actuator which extends parallel to the bending axis. In this embodiment, a displacement of the displacement unit relative to the second part is achieved as follows. First a first pair of contact surfaces positioned diagonally relative to one another are brought into contact with the second part, and the other pair of contact surfaces positioned diagonally relative to one another are withdrawn from the second part. Then the bending actuator is bent about the bending axis, so that the first bridge and the second bridge are rotated in mutually opposed directions about the contact surfaces which are in contact with the second part, so that the contact surfaces which were withdrawn from the second part are displaced in the displacement direction relative to the second part. Then the other pair of contact surfaces arranged diagonally relative to one another are brought into contact with the second part, and the first pair of contact surfaces arranged diagonally relative to one another are withdrawn from the second part, whereupon the bending actuator is bent about the bending axis in opposite direction. As a result, the first bridge and the second bridge will rotate in opposite directions about the contact surfaces which are in contact with the second part, so that the contact surfaces which were withdrawn from the second part are displaced in the displacement direction.

A further embodiment of a displacement device according to the invention is characterized in that the contact surfaces of each displacement unit positioned diagonally relative to one another are interconnected by two bridges which are each connected to the relevant contact surfaces positioned diagonally relative to one another via two elastic hinges which extend parallel to the bending axis. A distance obtaining between the pairs of contact surfaces positioned diagonally relative to one another does not change during the rotation of the first bridge and the second bridge about the contact surfaces which are in contact with the second part. The fact that the contact surfaces positioned diagonally relative to one another are interconnected by two bridges leads to a very rigid construction of the displacement units.

A yet further embodiment of a displacement device according to the invention is characterized in that the linear actuators are laminated piezoelectric actuators. The use of the laminated piezoelectric actuators provides very accurate displacements of the contact bodies relative to the first part. Furthermore, the dimensions of the displacement units are strongly reduced.

A particular embodiment of a displacement device according to the invention is characterized in that the bending actuator is a piezoelectric bending actuator. The use of the piezoelectric bending actuator provides very accurate displacements of the four contact surfaces in the displacement device. Furthermore, the dimensions of the displacement units are strongly reduced.

A further embodiment of a displacement device according to the invention is characterized in that the second part comprises a guiding surface, and the first part comprises an object table which is pretensioned relative to the second part in a direction perpendicular to the guiding surface and is displaceable along the guiding surface parallel to a first displacement direction and to a second displacement direction perpendicular to the first displacement direction through cooperation of the contact bodies of the first part with the guiding surface, the first part comprising at least three displacement units for each displacement direction. The displacement device in this embodiment is a so-called X-Y table, whose object table is displaceable along a guiding surface parallel to an X-direction and parallel to a Y-direction which is perpendicular to the X-direction. The displacement units have a combined displacement and bearing support function, whereby a simple construction of the X-Y table is provided.

A yet further embodiment of a displacement device according to the invention is characterized in that the second part comprises a guiding surface and the first part comprises an object table which is pretensioned relative to the second part in a direction perpendicular to the guiding surface and is displaceable along the guiding surface parallel to a first displacement direction and to a second displacement direction which is perpendicular to the first displacement direction through cooperation of the contact bodies of the first part with the guiding surface, the first part comprising four groups of four displacement units each, which groups are mutually positioned in a quadrangular arrangement, while the displacement units in a group are mutually arranged in a square. The displacement device is an X-Y table also in this embodiment, the displacement units being provided with spherical contact surfaces. The use of four groups of four displacement units each achieves a particularly stiff bearing support of the object table with respect to the guiding surface. Since the displacement units are provided with spherical contact surfaces, each displacement unit can be utilized both for displacements parallel to the X-direction and for displacements parallel to the Y-direction. The displacement units are optimally utilized in this manner.

A special embodiment of a displacement device according to the invention is characterized in that the first part comprises a bearing bush and the second part comprises a shaft which is provided with a circular-cylindrical guide and which is rotatable and displaceable in axial direction in the bearing bush through cooperation of the contact bodies of the first part with the circular-cylindrical guide, the first part comprising at least three displacement units for the rotation of the second part and at least three further displacement units for the axial displacement of the second part. This embodiment of the displacement device comprises an axially displaceable spindle which is supported with rotation possibility in a bearing bush. The displacement units have a combined displacement and bearing function, or a combined rotation function and bearing function, so that a simple construction of the spindle is achieved.

A further embodiment of a displacement device according to the invention is characterized in that the first part comprises a bearing bush and the second part comprises a shaft which is provided with a circular-cylindrical guide and which is rotatable and displaceable in axial direction in the bearing bush through cooperation of the contact bodies of the first part with the circular-cylindrical guide, the first part comprising four groups of four displacement units each adjacent a first end of the bearing bush and four further groups of four displacement units each adjacent a second end of the bearing bush, these groups being arranged with regular interspacings in circumferential direction around the bearing bush, while the displacement units within a group are mutually positioned in a square arrangement. In this embodiment, again, the displacement device comprises an axially displaceable spindle, while the displacement units have spherical contact surfaces. A particularly rigid bearing support of the shaft in the bearing bush is achieved by providing the first part with four groups of four displacement units each both adjacent the first and adjacent the second end of the bearing bush. Since the displacement units are provided with spherical contact surfaces, each displacement unit can be utilized both for the axial displacement of the shaft relative to the bearing bush and for the rotation of the shaft in the bearing bush. The displacement units are optimally utilized in this manner.

DETAILED DESCRIPTION OF THE PREFERRED EMBODIMENTS

Figure 1:
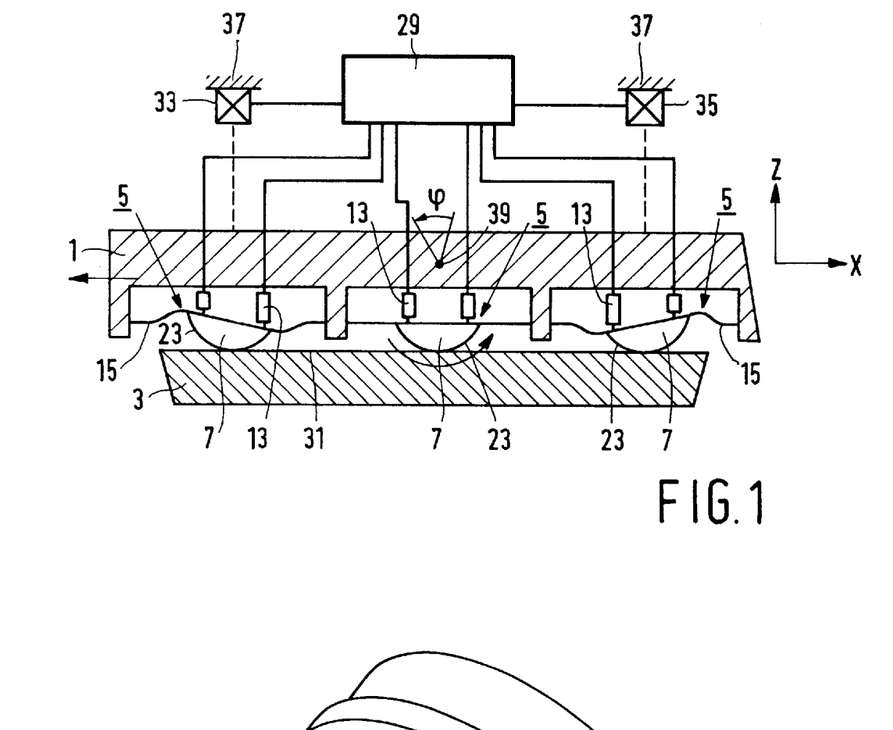
FIG. 1 diagrammatically shows a displacement device according to the invention.

The displacement device according to the invention shown in FIG. 1 comprises a first part 1 and a second part 3. The first part 1 is displaceable relative to the second part 3 parallel to a displacement direction X and is supported parallel to a support direction Z perpendicular to the displacement direction X in a manner to be described in more detail below. The first part 1 for this purpose comprises a number of displacement units 5 which are each provided with a contact body 7.

Figure 2:
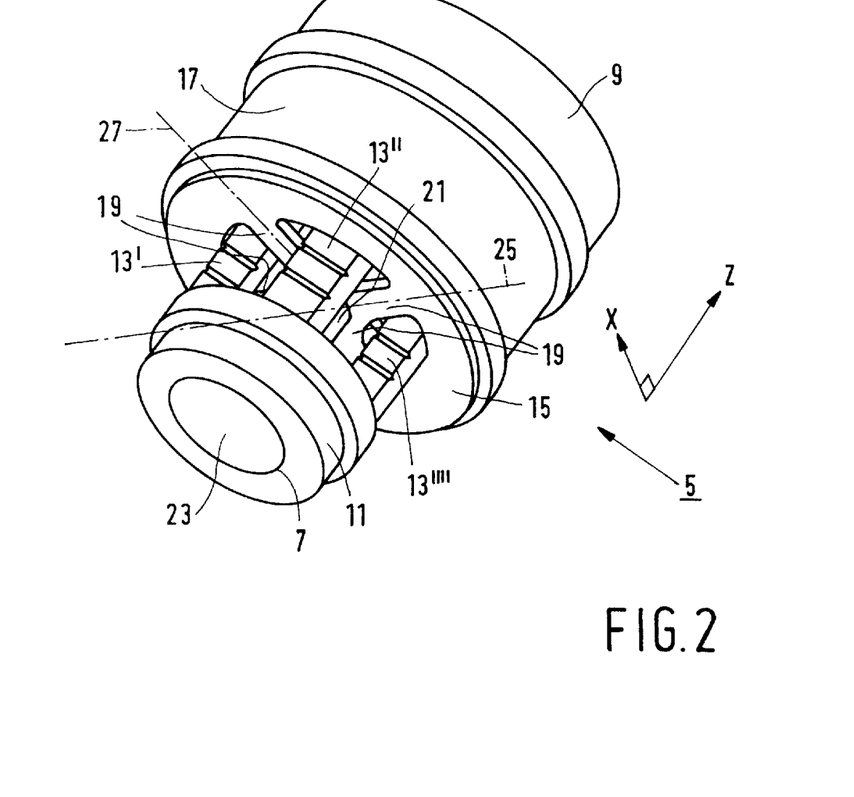
FIG. 2 shows a first embodiment of a displacement unit which is suitable for use in the displacement device of FIG. 1.
Figure 3A:
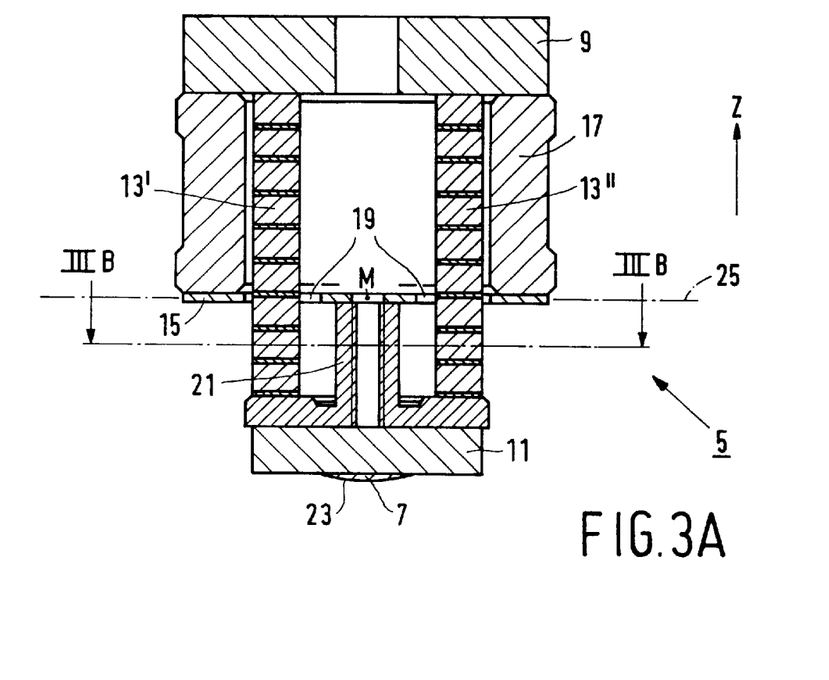
FIG. 3a is a longitudinal sectional view of the displacement unit of FIG. 2.
Figure 3B:
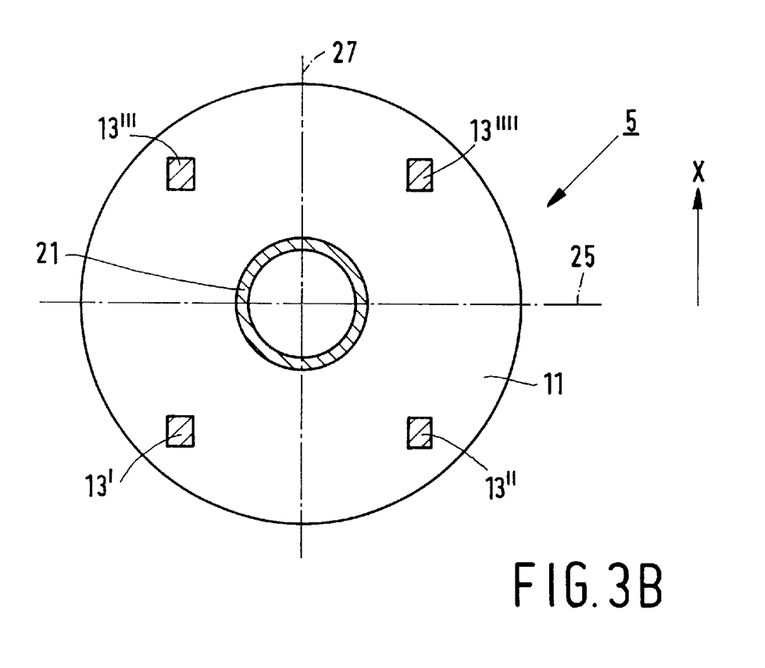
FIG. 3b is a cross-section taken on the line IIIb—IIIb in FIG. 3a, FIG. 4 shows a second embodiment of a displacement unit suitable for use in the displacement device of FIG. 1.

As FIGS. 2, 3a and 3b show, the displacement units 5 each comprise a mounting ring 9 by means of which the displacement unit 5 is fastened to the first part 1. The displacement unit 5 further comprises a support disc 11 on which the contact body 7 is provided. The support disc 11 is fastened to the mounting ring 9 by means of four linear actuators 13 which are positioned relative to one another in a square arrangement. The linear actuators 13 each comprise a laminated piezoelectric actuator which extends parallel to the support direction Z and which is capable of activation parallel to the support direction Z. The displacement unit 5 further comprises an annular membrane 15 which extends perpendicularly to the support direction Z and which is fastened to the mounting ring 9 by means of a bush 17. The membrane 15 is further fastened by means of four flexible spokes 19 to an inner bush 21 which is fastened to the support disc 11, said four spokes 19 extending between the four actuators 13 in an imaginary plane defined by the membrane 15.

As FIGS. 1, 2 and 3a show, the contact bodies 7 of each displacement unit 5 each have a spherical contact surface 23 which comprises a portion of a surface of an imaginary sphere. The center M of the spherical contact surface 23 as shown in FIG. 3a coincides substantially with the center of the annular membrane 15, so that the contact surface 23 is rotatable through limited angles relative to the mounting ring 9 and the first part 1 about each and every centerline of said imaginary sphere which lies in the plane of the membrane 15 under elastic deformation of the spokes 19 and the membrane 15. In particular, the contact surface 23 is rotatable about a centerline 25 if the pair of mutually adjacent actuators 13' and 13" present at one side of the centerline 25 and the pair of mutually adjacent actuators 13''' and 13"" present at the other side of the centerline 25 are actuated in mutually opposed directions, and the contact surface 23 is rotatable about a centerline 27 perpendicular to the centerline 25 if the pair of mutually adjacent actuators 13' and 13''' present at one side of the centerline 27 and the pair of mutually adjacent actuators 13" and 13"" present at the other side of the centerline 27 are activated in mutually opposed directions. Furthermore, the contact surface 23 is displaceable over a limited distance parallel to the support direction Z and under elastic deformation of the spokes 19 and the membrane 15 if the four actuators 13 are activated all in the same direction.

It is noted that FIG. 1 is merely a diagrammatic representation of a displacement device according to the invention which is only provided with a minimum number of three displacement units 5 theoretically required for displacing the first part 1 parallel to a single displacement direction X and supporting the first part 1 parallel to the support direction Z which is perpendicular to the displacement direction X. As will become apparent further below, a displacement device according to the invention may be provided with a different number of displacement units for displacing the first part in more than one displacement direction. The operation of the displacement device, however, will be explained below with reference to the diagrammatic example of FIG. 1.

The first part 1 is pretensioned relative to the second part 3 parallel to the support direction Z by pretensioning means which are not shown in any detail in FIG. 1 and which are usual and known per se, for example comprising an underpressure chamber provided in the first part 1, or an electromagnetic pretensioning member, or an elastically deformable pretensioning member. As FIG. 1 shows, the actuators 13 of the displacement units 5 are controlled by an electronic control member 29 of the displacement device. The actuators 13 are controlled by the control member 29 such that at any moment at least two of the three spherical contact surfaces 23 are pressed against a straight guide 31 of the second part 3, so that the first part 1 is supported by at least two of the three contact surfaces 23 parallel to the support direction Z relative to the second part 3 against a pretensioning force of the pretensioning means. As FIG. 1 further shows, the displacement device comprises a position sensor system which comprises at least a first optical position sensor 33 and a second optical position sensor 35. The position sensors 33 and 35 are fastened to a frame 37 which belongs to the second part 3 and measure a position of the first part 1 relative to the second part 3 parallel to the support direction Z in two different locations. An average position of the first part 1 relative to the second part 3 parallel to the support direction Z and a pivot angle φ of the first part 1 about a pivot axis 39 which is perpendicular to the displacement direction X and perpendicular to the support direction Z can thus be measured by means of the two position sensors 33 and 35. The control member 29, the position sensors 33 and 35, and the actuators 13 form part of a feedback control by means of which displacements of the contact bodies 7 parallel to the support direction Z can be controlled.

The displacements of the contact bodies 7 parallel to the support direction Z are controlled by means of said feedback control such that the first part 1 is held in a desired position relative to the second part 3 parallel to the support direction Z by means of the contact bodies 7, and that the pivot angle φ of the first part 1 has a desired value. The contact bodies 7 thus not only have a supporting function but also a bearing function, i.e. a supporting function in which the first part 1 is in addition held in an accurately defined position relative to the second part 3 perpendicular to the displacement direction X.

As was discussed above, the contact bodies 7 are not only displaceable parallel to the support direction Z through activation of the actuators 13 in the same direction, whereby the bearing function is provided, but the contact bodies 7 are also rotatable through limited angles about the centerlines 25 and 27 of the spherical contact surfaces 23 through actuation of the actuators 13 in opposite directions. It is noted that the contact bodies 7 shown in FIG. 1 are rotated exclusively about the centerlines 25 which extend perpendicularly to the displacement direction X and to the support direction Z. If the contact bodies 7 pressed against the second part 3 are rotated about the centerlines 25 with equal angular velocities, a pure rolling motion between the spherical contact surfaces 23 and the guide 31 of the second part 3 will take place, provided there is a sufficient pretensioning force between the first part 1 and the second part 3. As a result of this rolling motion, the first part 1 is displaced relative to the second part 3 parallel to the displacement direction X under the influence of a friction force present between the contact surfaces 23 and the guide 31. Since the contact bodies 7 are rotated about the centerlines 25, the contact bodies 7 are not displaced parallel to the support direction Z as a result of the rotation. The bearing support function and the displacement function of the contact bodies 7 are thus performed independently of one another by means of displacements of the contact bodies 7 parallel to the support direction Z and rotations of the contact bodies 7 about the centerlines 25, respectively.

Since at least two spherical contact surfaces 23 are necessary for supporting the first part 1 perpendicularly to the displacement direction X and the contact bodies 7 are rotatable through limited angles only, a third contact body 7 is necessary for providing an uninterrupted displacement of the first part 1 in one direction. The actuators 13 of the displacement units 5 are each controlled so as to perform a stepwise movement by means of the control member 29. During a stepwise movement, a contact body 7 is rotated through a limited angle from a starting position to an end position. Then the contact body 7 is withdrawn from the second part 3, rotated back from the end position to the starting position, and pressed against the second part 3 again, whereupon the stepwise movement is repeated. A phase angle of 120° lies between the stepwise movements of the three contact bodies 7 each time, while the return rotation of each contact body 7 takes place within a comparatively short period. It is achieved thereby that at least two of the three contact bodies 7 are in contact with the second part 3 at any moment for supporting this second part 3.

Since the contact bodies 7 as described above have a combined bearing support and displacement function, the number of components necessary for supporting and displacing the second part 3 relative to the first part 1 remains limited. The use of the laminated piezoelectric actuators 13 and the feedback control provides a particularly accurate bearing support parallel to the support direction Z, while in addition particularly accurate displacements of the first part 1 parallel to the displacement direction X are achievable. It is noted that for this purpose the displacement device may be provided, for example, with a further feedback control with sensors for measuring a displacement of the first part 1 relative to the second part 3 parallel to the displacement direction X. The use of the membranes 15 and the spokes 19 in the displacement units 5 achieves that the laminated piezoelectric actuators 13 are not mechanically loaded in a direction perpendicular to the support direction Z, while nevertheless the contact bodies 7 have sufficient possibilities of movement for performing the necessary stepwise rotational movements and displacements parallel to the support direction Z.

An advantageous modular construction of the displacement device results from the fact that the contact bodies 7 each belong to a separate displacement unit 5, and the displacement units 5 are each provided with a separate actuator system comprising four linear actuators 13 for the stepwise movement of the contact bodies 7 and the displacement of the contact bodies 7 parallel to the support direction Z. As will become apparent further below, a number of contact bodies required as determined in the design phase of the displacement device can be realized in the displacement device in a simple and effective manner. It is further noted that the rotation possibility of the contact bodies 7 about the centerlines 25 and 27 may alternatively be provided by means of three linear actuators which are mutually positioned in a triangle. As was described above, however, the required movements of the contact bodies 7 are obtained by means of a particularly simple control of the actuators 13 if four actuators 13 are used.

Figure 4:
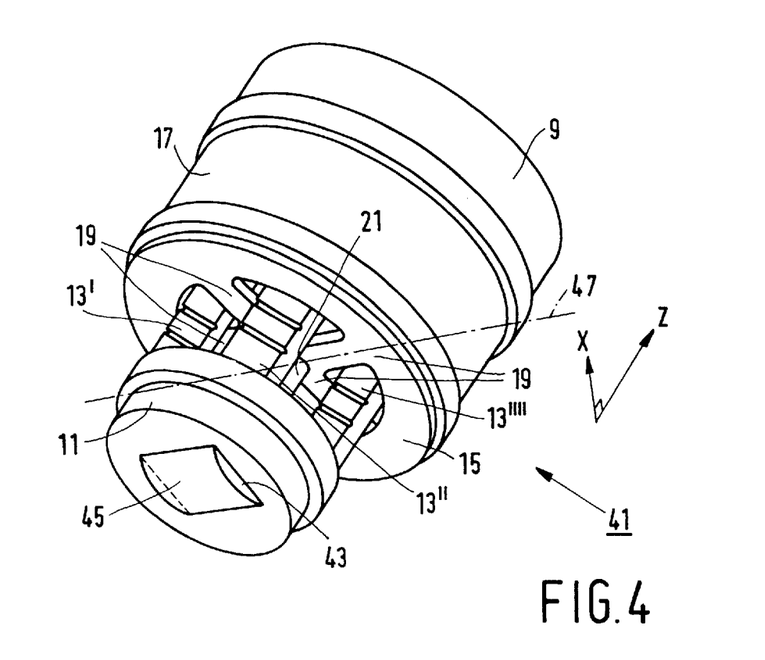

As was described above, the contact bodies 7 shown in FIG. 1 are rotated exclusively about those centerlines 25 which are perpendicular to the displacement direction X. FIG. 4 shows a second embodiment of a displacement unit 41 suitable for use in the displacement device shown in FIG. 1 instead of the displacement unit 5 shown in FIG. 2. Corresponding components of the displacement units 5 and 41 have been given the same reference numerals in FIGS. 2 and 4. The displacement unit 41 differs from the displacement unit 5 described above mainly in that the displacement unit 41 is provided with a contact body 43 with a contact surface 45 which comprises a portion of a surface of an imaginary circular cylinder. The cylindrical contact surface 45 has a centerline 47 which lies in the plane of the membrane 15 and extends perpendicularly to the displacement direction X. The linear actuators 13' and 13" are positioned at one side of the centerline 47, and the linear actuators 13'" and 13"" are positioned at the other side of the centerline 47. The actuators 13' and 13" of the displacement unit 41 are always activated in the same manner, and the actuators 13'" and 13"" are also always activated in the same manner. If the pair of actuators 13' and 13" and the pair of actuators 13'" and 13"" are activated in mutually opposed directions, the cylindrical contact body 43 is rotated about the centerline 47, whereas the contact body 43 is displaced parallel to the support direction Z through activation of all four actuators 13 in the same direction. The use of the displacement units 41 in the displacement device of FIG. 1 also requires at least three displacement units 41 for providing an uninterrupted displacement of the first part 1 in one direction. The three displacement units 41 are controlled by the control member 29 in a manner identical to that described above for the displacement units 5, the displacement units 41 performing stepwise rotational movements about the centerlines 47 with mutual phase angles of 120°, while a pure rolling motion takes place between the cylindrical contact surfaces 45 and the guide 31 of the second part 3, provided there is a sufficient pretensioning force between the first part 1 and the second part 3. It is noted that a rotational movement of the contact bodies 43 about the centerlines 47 may also be obtained in that only two linear actuators are used instead of the four linear actuators 13, which two linear actuators are positioned, for example, on either side of the centerline 47. The rotation freedom of the contact bodies 43 about the centerlines 47 may also be achieved in that rectangular membranes are used instead of the annular membranes 15, the centerline 47 of each cylindrical contact surface 45 lying in an imaginary plane defined by the rectangular membrane parallel to a long side of the rectangular membrane.

Figure 5:
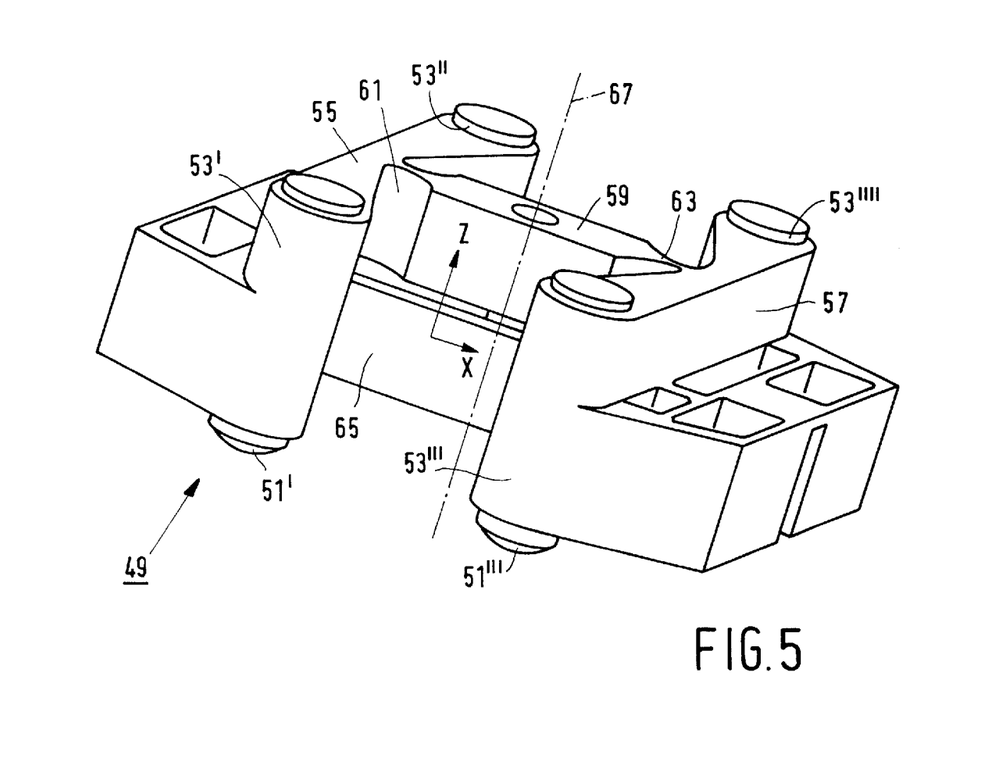
FIG. 5 shows a third embodiment of a displacement unit suitable for use in the displacement device of FIG. 1.
Figure 6:
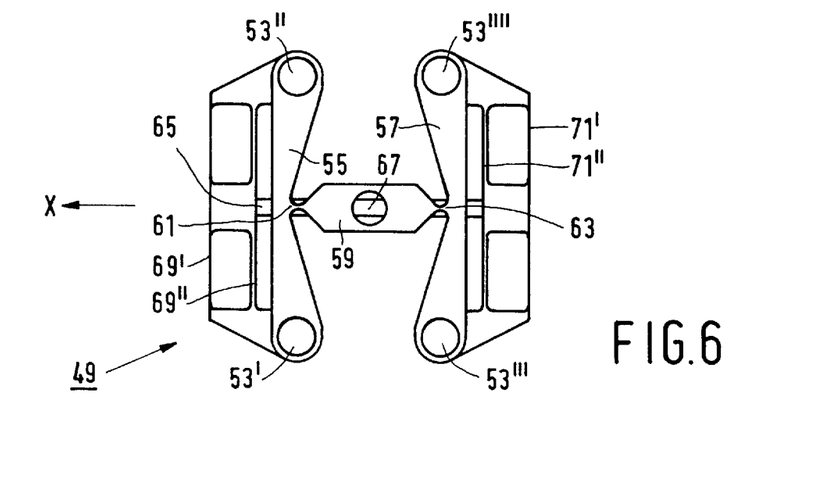
FIG. 6 is a plan view of the displacement unit of FIG. 5, FIG. 7a diagrammatically shows the displacement unit of FIG. 5 in a neutral position, FIG. 7b diagrammatically shows the displacement unit of FIG. 5 in a first extreme position, FIG. 7c diagrammatically shows the displacement unit of FIG. 5 in a second extreme position.

FIGS. 5 and 6 show a third embodiment of a displacement unit 49 suitable for use in the displacement device shown in FIG. 1. The displacement unit 49 is only suitable for displacements of the first part 1 parallel to one direction, as is the displacement unit 41 shown in FIG. 4. The displacement unit 49 comprises four contact surfaces 51 which are mutually arranged in a quadrangle. The contact surfaces 51 are each displaceable parallel to the support direction Z by means of a separate linear laminated piezoelectric actuator 53. The actuators 53' and 53" of the contact surfaces 51' and 51" are fastened to a first bridge 55 which extends transversely to the displacement direction X, while the actuators 53'" and 53"" of the contact surfaces 51'" and 51"" are fastened to a second bridge 57 which also extends transversely to the displacement direction X. The first bridge 55 and the second bridge 57 are positioned at a distance from one another, seen parallel to the displacement direction X, and are interconnected by a third bridge 59 by means of which the displacement unit 49 can be fastened to the first part 1 of the displacement device shown in FIG. 1. The third bridge 59 extends parallel to the displacement direction X, is fastened to the first bridge 55 by means of a first elastic hinge 61 which extends parallel to the support direction Z, and is fastened to the second bridge 57 by means of a second elastic hinge 63 which also extends parallel to the support direction Z. The use of the elastic hinges 61 and 63 renders the first bridge 55 and the second bridge 57 rotatable through limited angles relative to the third bridge 59. The first bridge 55 and the second bridge 57 are further connected to one another by means of a plate-shaped piezoelectric bending actuator 65 which extends parallel to the displacement direction X and to the support direction Z and which is capable of bending about a bending axis 67 which extends parallel to the support direction Z and parallel to the hinges 61 and 63. As FIG. 6 shows, the bending actuator 65 is fastened to the first bridge 55 by means of blade springs 69' and 69" extending transversely to the displacement direction X, and is fastened to the second bridge 57 by means of blade springs 71' and 71" extending also transversely to the displacement direction X.

Figure 7A:
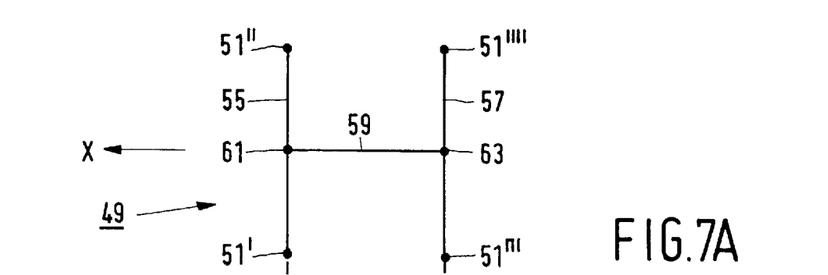
Figure 7B:
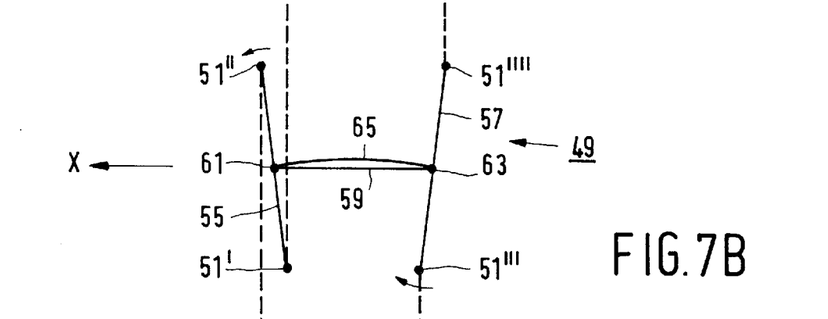
Figure 7C:
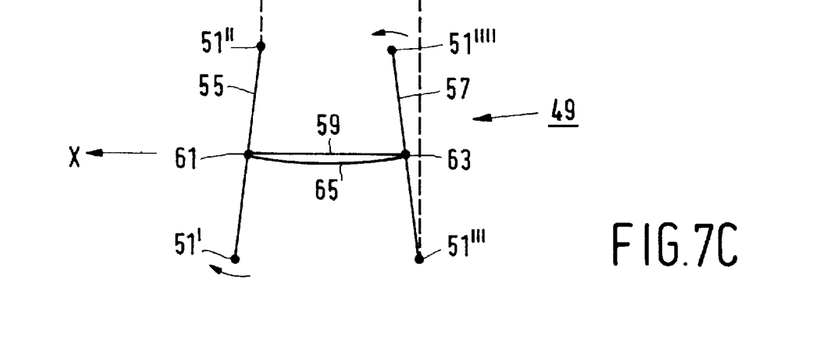

The operation of the displacement unit 49 will be explained below with reference to FIGS. 7a, 7b and 7c. FIG. 7a diagrammatically shows the displacement unit 49 with the bending actuator 65 not being energized. In this neutral position of the displacement unit 49, the first bridge 55 and the second bridge 57 extend perpendicularly to the displacement direction X. Starting from the neutral position shown in FIG. 7a, the diagonally opposed contact surfaces 51" and 51"' are withdrawn from the second part 3, so that the displacement unit 49 is in contact with the second part 3 exclusively via the diagonally opposed contact surfaces 51' and 51"". Then the bending actuator 65 is bent about the bending axis 67 through activation in a first direction. The first bridge 55 and the second bridge 57 are rotated about the hinges 61 and 63 in opposite directions thereby with respect to the third bridge 59 so as to reach a first extreme position shown in FIG. 7b. Since the contact surfaces 51' and 51"" remain in contact with the second part 3 and are not displaced relative to the second part 3, provided there is a sufficient pretensioning force between the first part 1 and the second part 3, the first bridge 55 and the second bridge 57 will rotate with respect to the second part 3 in mutually opposed directions about the contact surfaces 51' and 51"", so that the contact surfaces 51" and 51"' are displaced relative to the second part 3 in the same direction parallel to the displacement direction X. In the first extreme position of the displacement unit 49 shown in FIG. 7b, the contact surfaces 51" and 51"' are subsequently brought into contact with the second part 3, whereupon the contact surfaces 51' and 51"" are withdrawn from the second part 3. The bending actuator 65 is now bent in the opposite direction about the bending axis 67 so that the first bridge 55 and the second bridge 57 are rotated with respect to the third bridge 59 about the hinges 61 and 63 in directions which are opposed to the directions shown in FIG. 7b so as to reach a second extreme position shown in FIG. 7c. Since it is the contact surfaces 51" and 51"' which remain in contact with the second part 3 and which are not displaced relative to the second part 3 now, the first bridge 55 and the second bridge 57 will rotate about the contact surfaces 51" and 51"' with respect to the second part 3 in directions opposed to the directions shown in FIG. 7b, so that the contact surfaces 51' and 51"" are displaced relative to the second part 3 parallel to the displacement direction X in a direction corresponding to the direction in which the contact surfaces 51" and 51"' were displaced in FIG. 7b. The contact surfaces 51' and 51"" are brought into contact with the second part 3 again now, the contact surfaces 51" and 51"' are detached from the second part 3 again, and the bending actuator 65 is bent again into the first extreme position shown in FIG. 7b, so that the stepwise movement of the displacement unit 49 has been completed upon passing of the neutral position, and a next stepwise movement is started. As is apparent from FIGS. 7a, 7b, and 7c and from the preceding description, the displacement unit 49 is displaced over a limited distance parallel to the displacement direction X relative to the second part 3 during a full stepwise movement.

Figure 8:
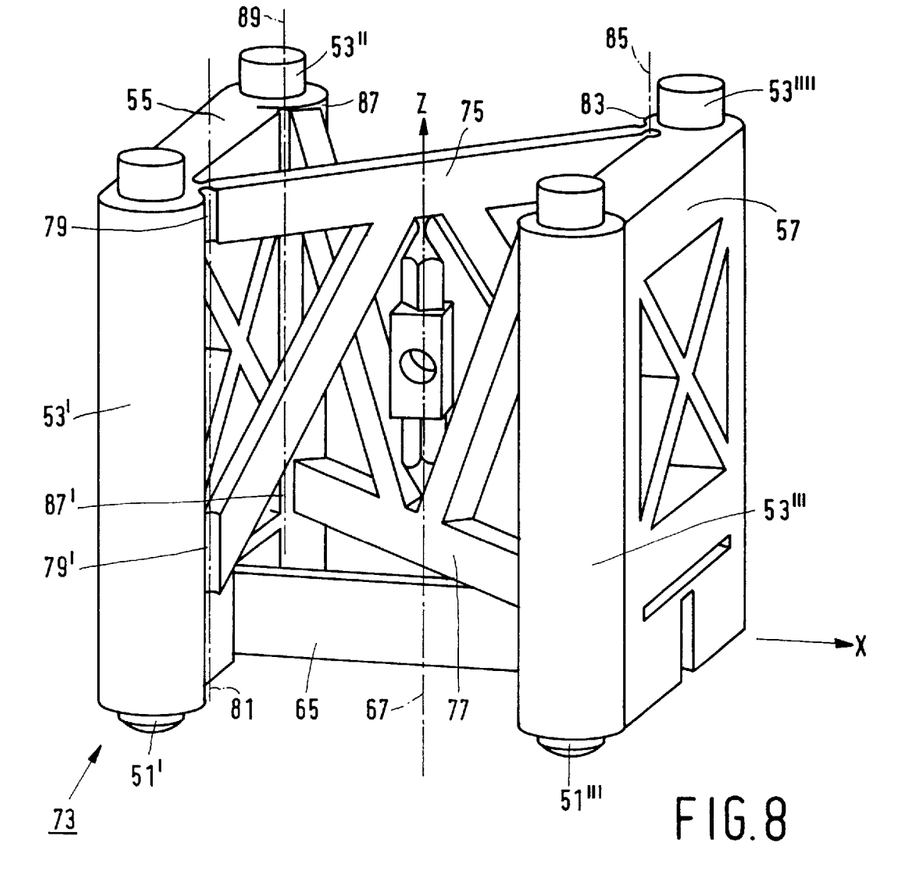
FIG. 8 shows a fourth embodiment of a displacement unit suitable for use in the displacement device of FIG. 1.
Figure 9:
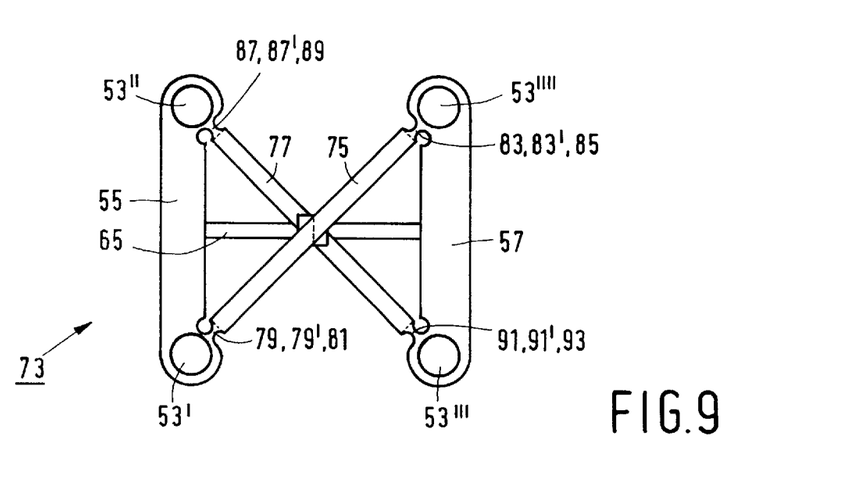
FIG. 9 is a plan view of the displacement unit of FIG. 7, FIG. 10 diagrammatically shows an X-Y table which is provided with a displacement device as shown in FIG. 1, FIG. 11 diagrammatically shows a spindle device provided with a displacement device as shown in FIG. 1.

If the first bridge 55 and the second bridge 57 of the displacement unit 49 are rotated relative to the third bridge 59 in the manner described above, the distance between the diagonally opposed contact surfaces 51' and 51"" and the distance between the diagonally opposed contact surfaces 51" and 51"' remain the same. This kinematic property of the displacement unit 49 is utilized in the fourth embodiment of a displacement unit 73 shown in FIGS. 8 and 9 which is again suitable for use in the displacement device shown in FIG. 1. Components of the displacement unit 73 in FIGS. 8 and 9 corresponding to those of the displacement unit 49 shown in FIG. 5 have been given the same reference numerals. The displacement unit 73 is only suitable for displacement of the first part 1 parallel to one direction, as is the displacement unit 49. The first bridge 55 and the second bridge 57 in the displacement unit 73 are interconnected by means of a third bridge 75 and a fourth bridge 77. The third bridge 75 interconnects the diagonally opposed actuators 53' and 53"", while the fourth bridge 77 interconnects the diagonally opposed actuators 53" and 53"'. The third bridge 75 is fastened to the actuator 53' by means of two elastic hinges 79 and 79' which have a common hinge axis 81 which extends parallel to the support direction Z, and is 30 fastened to the actuator 53"" by means of two elastic hinges 83 and 83' which have a common hinge axis 85 which extends parallel to the support direction Z. The fourth bridge 77 is fastened to the actuator 53" by means of two elastic hinges 87 and 87' which have a common hinge axis 89 which extends parallel to the support direction Z, and is fastened to the actuator 53"' by means of two elastic hinges 91 and 91' which have a common hinge axis 93 which extends parallel to the support direction Z. The operation of the displacement unit 73 corresponds to the operation of the displacement unit 49 in FIG. 5. The use of the mutually crossing bridges 75 and 77 leads to a very rigid construction of the displacement unit 73. It is noted that the displacement units 49, 73 are in contact with the second part 3 via at least two of the four contact surfaces 51 at any moment during a stepwise movement. This means that a minimum of only two displacement units 49, 73 is necessary for providing an uninterrupted displacement of the first part 1 parallel to the displacement direction X and for providing an uninterrupted bearing support of the first part 1 parallel to the support direction Z when the displacement units 49, 73 are used in the displacement device of FIG. 1.

Figure 10:
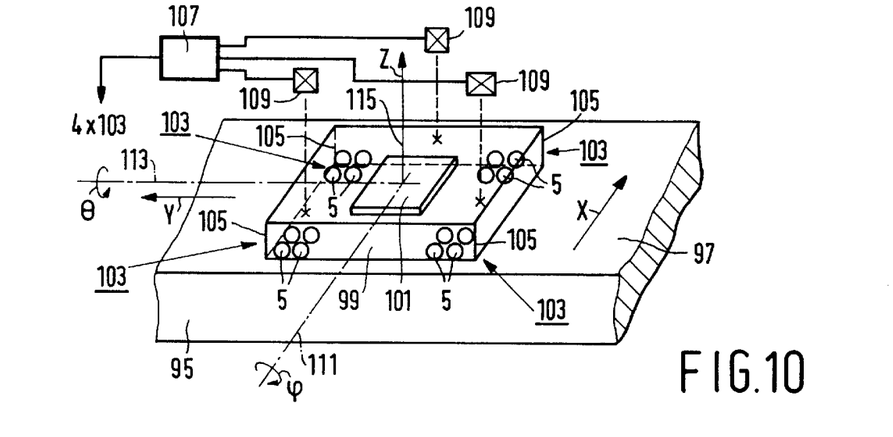

FIG. 10 diagrammatically shows an X-Y table which is provided with a displacement device according to the invention. The X-Y table comprises a base 95 with a guiding surface 97 which extends parallel to an X-direction and parallel to a Y-direction perpendicular to the X-direction. The X-Y table further comprises an object table 99 having a support surface 101 for an object to be displaced. The object table 99 is pretensioned relative to the base 95 in a support direction Z perpendicular to the guiding surface 97 by pretensioning means which are not shown in FIG. 10 and which are usual and known per se. The displacement device according to the invention used in the X-Y table comprises four groups 103 of four displacement units 5 each as described above and shown in FIG. 2. The spherical contact bodies 7 of the displacement units 5 cooperate with the guiding surface 97 of the base 95. The individual displacement units 5 have been indicated diagrammatically only in FIG. 10 each by means of an O, symbolically depicting the spherical contact surface 23 of a displacement unit 5, for the sake of simplicity. As FIG. 10 shows, the four groups 103 are mutually arranged in a quadrangle adjacent the four corners 105 of the object table 99, and the four displacement units 5 within a group 103 are mutually arranged in a square. The sixteen displacement units 5 are controlled by a control member 107 of the X-Y table. The displacement device according to the invention used in the X-Y table further comprises three optical position sensors 109 which are arranged in fixed positions relative to the base 95. The position sensors 109 measure a position occupied by the object table 99 relative to the base 95 parallel to the support direction Z, as well as a pivot angle φ of the object table 99 about a main axis 111 of the object table 99 directed parallel to the X-direction, and a pivot angle θ of the object table 99 about a main axis 113 of the support surface 101 directed parallel to the Y-direction. The control member 107 carries out a feedback control by means of which the object table 99 is held in a desired position parallel to the support direction Z with respect to the base 95, and by means of which the object table 99, if so desired, is held in a position parallel to the X-direction and the Y-direction. An accurate bearing support of the object table 99 relative to the base 95 parallel to the support direction Z is thus provided by means of the displacement units 5. The use of the four groups 103 of four displacement units 5 each renders the bearing support particularly stiff and stable.

As was described above, the displacement units 5 used in the X-Y table each comprise a spherical contact surface 23 which is stepwise rotatable about two centerlines 25 and 27 of the spherical contact surface 23 (see FIG. 2) which are mutually perpendicular. The displacement units 5 are accordingly each suitable for generating displacements of the object table 99 over the guiding surface 97 of the base 95 parallel to the X-direction and parallel to the Y-direction, for which purpose they are indeed used. Each displacement unit 5 of the displacement device according to the invention used in the X-Y table is thus optimally utilized.

It is noted that the X-Y table may be provided with a further position sensor for measuring displacements of the object table 99 relative to the base 95 parallel to the X-direction, and two further position sensors for measuring displacements of the object table 99 relative to the base 95 parallel to the Y-direction and rotations of the object table 99 about a main axis 115 of the support surface 101 directed parallel to the support direction Z. When these further position sensors are used, for example, the control member 107 carries out a further feedback control by means of which the object table 99 is accurately displaceable into a desired X-position and Y-position, and by means of which a desired angle of rotation of the object table 99 about the main axis 115 can be accurately adjusted. Such an angle of rotation about the main axis 115 which extends parallel to the support direction Z can also be achieved through a suitable control of the displacement units 5.

It is further noted that the X-Y table may also be provided with a different number of displacement units 5 or with displacement units of a different type. If displacement units 5 provided with spherical contact bodies 7 are used in the X-Y table, at least three displacement units 5 are theoretically necessary for an uninterrupted displacement of the object table 99 in a single direction and a bearing support of the object table 99 perpendicular to this direction, as was described above. Since the displacement units 5 can be utilized both for displacements parallel to the X-direction and for displacements parallel to the Y-direction, however, a minimum of four displacement units 5 is theoretically necessary for generating uninterrupted displacements of the object table 99 parallel to the X-direction or the Y-direction and for the bearing support of the object table 99 perpendicular to the X-direction and the Y-direction, the object table 99 being supported by at least three contact bodies 7 at any moment during this. At least three displacement units 41 should be used for generating displacements of the object table 99 parallel to the X-direction and at least three further displacement units 41 for generating displacements of the object table 99 parallel to the Y-direction if the displacement units 41 with the cylindrical contact bodies 43 as described above are used, in which case the object table 99 is supported by at least three contact bodies 43 at any moment. At least two displacement units 49 should be used for generating displacements of the object table 99 parallel to the X-direction and at least two further displacement units 49 for generating displacements of the object table 99 parallel to the Y-direction if the displacement units 49 with the four contact surfaces 51 as described above are used, in which case the object table 99 is supported by all displacement units 49 at all times.

Figure 11:
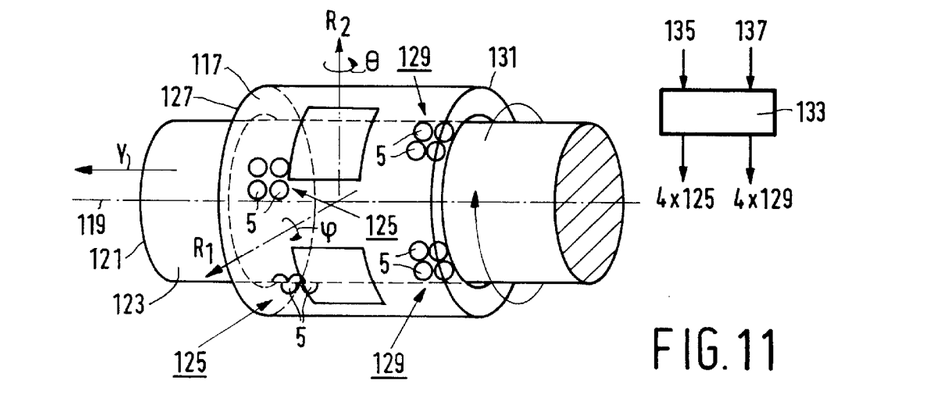
Figure 12:
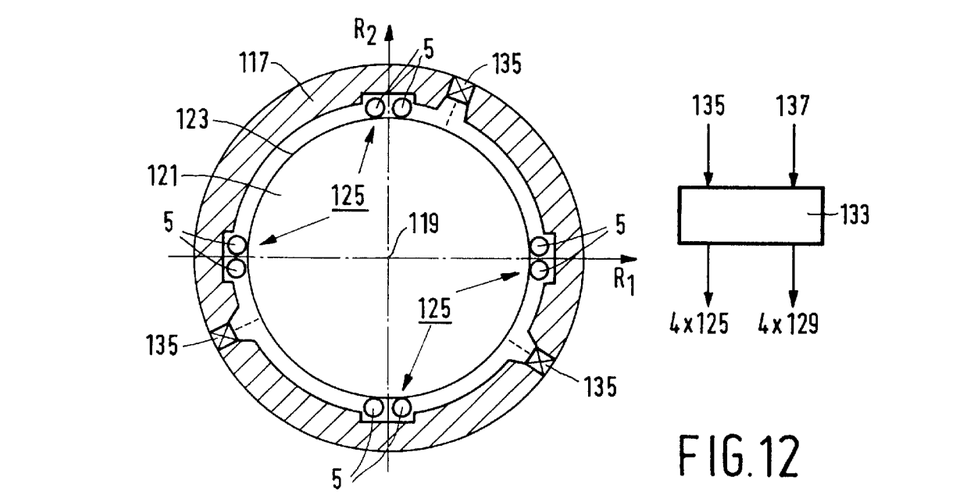
FIG. 12 is a diagrammatic cross-section through the spindle device of FIG. 11.

FIGS. 11 and 12 finally diagrammatically show a spindle device which is also provided with a displacement device according to the invention. The spindle device comprises a static bearing bush 117 which has a central main axis 119 and which is fastened to a base of the spindle device which is not shown in the Figures. The spindle device further comprises a shaft 121 which is provided along a circumference with a circular-cylindrical guide 123. The displacement device according to the invention used in the spindle device comprises four groups 125 of four displacement units 5 each, which are fastened in the bearing bush 117 adjacent a first end 127 of the bearing bush 117 for cooperating with the guide 123 of the shaft 121, and four further groups 129 of four displacement units 5 each which are fastened in the bearing bush 117 adjacent a second end 131 of the bearing bush 117 for cooperating with the guide 123 of the shaft 121. The displacement units 5 are of a type shown in FIG. 2 and each comprise a spherical contact surface 23 for cooperating with the guide 123 of the shaft 121. The individual displacement units 5 have been depicted diagrammatically only in FIGS. 11 and 12 by means of an O, symbolically representing the spherical contact surface 23 of a displacement unit 5, for the sake of simplicity. FIG. 12 is a cross-section of the spindle device taken adjacent the first end 127 of the bearing bush 117. It is evident from FIG. 12 that the four groups 125 are positioned at regular mutual interspacings as seen in circumferential direction around the shaft 121. The four further groups 129 adjacent the second end 131 are positioned in a similar manner in circumferential direction. As is visible in FIG. 11, the four displacement units 5 in each group 125, 129 are mutually positioned in a square arrangement. The displacement units 5 of the groups 125, 129 are controlled by a control member 133 of the spindle device. The displacement device according to the invention used in the spindle device further comprises three optical position sensors 135 which are fastened in the bearing bush 117 adjacent the first end 127 of the bearing bush 117, and three further optical position sensors 137 which are fastened in the bearing bush 117 adjacent the second end 131 of the bearing bush 117. The position sensors 135, 137 are not shown in FIG. 11 for the sake of simplicity, while the position sensors 135 only are shown in FIG. 12. The position sensors 137 are provided adjacent the second end 131 in a similar manner. The position sensors 135 and 137 measure a position occupied by the shaft 121 relative to the bearing bush 117 parallel to an $R_1$ axis which is perpendicular to the main axis 119 and parallel to an $R_2$ axis which is perpendicular to the main axis 119 and to the $R_1$ axis, as well as a pivot angle φ of the shaft 121 about the $R_1$ axis and a pivot angle θ of the shaft 121 about the $R_2$ axis. The control member 133 carries out a feedback control by means of which the shaft 121 is held in a desired position relative to the bearing bush 117 parallel to the $R_1$ axis and parallel to the $R_2$ axis, and by means of which the shaft 121 is kept in a position parallel to the main axis 119, if so desired. An accurate bearing support of the shaft 121 with respect to the bearing bush 117 is thus provided by the displacement units 5. The use of the four groups 125 of four displacement units 5 each and the four further groups 129 of four displacement units 5 each renders the bearing particularly stiff and stable. It is noted that the displacement units 5 not only have a bearing function in the directions perpendicular to the main axis 119, but also have a pretensioning function in these directions. No further pretensioning means are accordingly necessary in these directions in the spindle device described.

As was described above, the displacement units 5 used in the spindle device each comprise a spherical contact surface 23 which is stepwise rotatable about two mutually perpendicular centerlines 25 and 27 of the spherical contact surface 23 (see FIG. 2). The displacement units 5 are accordingly each suitable for generating displacements of the shaft 121 parallel to the main axis 119 and rotations of the shaft 121 about the main axis 119, and are indeed used for these purposes. Each displacement unit 5 of the displacement device according to the invention used in the spindle device is optimally utilized in this manner.

The spindle device may be used, for example, in a machine tool for machining a workpiece, where an end of the shaft 121 of the spindle device is provided with a chuck for fastening the workpiece. The spindle device may be further provided with a further position sensor for measuring displacements of the shaft 121 relative to the bearing bush 117 directed parallel to the main axis 119. If this further position sensor is used, the control member 133 is provided, for example, with a further feedback control by means of which the shaft 121 can be accurately displaced into a desired position parallel to the main axis 119.

It is further noted that the spindle device may also be provided with a different number of displacement units 5 or with displacement units of a different type. If displacement units 5 provided with spherical contact bodies 7 are used in the spindle device, at least three displacement units 5 are theoretically necessary for an uninterrupted displacement of the shaft 121 in a single direction and a bearing support of the shaft 121 perpendicular to this direction, as described above. Since the displacement units 5 can be utilized both for displacements of the shaft 121 parallel to the main axis 119 and for rotations of the shaft 121 about the main axis 119, however, at least four displacement units 5 are theoretically necessary for generating uninterrupted displacements of the shaft 121 parallel to the main axis 119 and for supporting the shaft 121 perpendicularly to the main axis 119, during which the shaft 121 is supported by at least three contact bodies 7 at any moment. As was noted above, the shaft 121 of the spindle device shown in FIGS. 11 and 12 is in addition also pretensioned perpendicularly to the main axis 119 by means of the displacement units 5. Such a triple function of the displacement units 5 may be achieved, for example, by using at least four displacement units 5 arranged at regular interspacings in circumferential direction, adjacent both ends 127, 131 of the bearing bush 117. If the displacement units 41 with the cylindrical contact bodies 43 or the displacement units 49 with the four contact surfaces 51 are used, as described above, at least four displacement units 41, 49 should also be used adjacent both ends 127, 131 of the bearing bush 117. in this case the displacement units 41, 49 arranged adjacent the end 127 generate, for example, the displacements of the shaft 121 parallel to the main axis 119, while the displacement units 41, 49 arranged adjacent the end 131 generate, for example, the rotations of the shaft 121 about the main axis 119. If, however, the shaft 121 is pretensioned perpendicularly to the main axis 119 by separate pretensioning means, two separate groups of at least three displacement units 41, 49 each should be used for generating the displacements parallel to the main axis 119 and for generating the rotations about the main axis 119.

In the embodiments of a displacement device according to the invention as described above and the displacement units used therein, the actuators are constructed as linear laminated piezoelectric actuators or as piezoelectric bending actuators. It is noted that an alternative type of actuator may also be used in a displacement device according to the invention and the displacement units used therein, such as, for example, an electromagnetic actuator.

The above descriptions of embodiments of a displacement device according to the invention refer to certain specific numbers of displacement units each time. It is noted in a general sense that the number of displacement units to be used will be dependent inter alia on the number of displacement possibilities of the displacement device, the desired rigidity of the bearing, and the admissible degree of disturbances of the displacements in the displacement direction. A stiffer bearing support is obtained, and disturbances of the displacements, arising from the fact that the individual contact bodies are detached from the second part each time and pressed against the second part again, are more strongly reduced in proportion as more displacement units are used. It is thus possible, for example, to use a much greater number of displacement units, arranged at comparatively short distances from one another in circumferential direction adjacent the two ends of the bearing bush, in the spindle device described above, while also displacement units may be used in positions between the two ends of the bearing bush.

It is finally noted that a displacement device according to the invention may be used not only in an X-Y table and a spindle device, but also in a different type of device in which a first part and a second part are to be displaced relative to one another. Examples which spring to mind are a slide which is supported relative to a base with displacement possibility in one direction only, or a table which is supported on a base and can be rotated relative to this base exclusively about an axis of rotation which extends parallel to the support direction.

We claim:

1. A displacement device comprising a first part comprising at least two contact bodies which can be pressed against a second part and are each rotationally movable stepwise relative to the first part by means of at least two linear actuators such that the first and the second part are displaceable relative to one another in a displacement direction under the influence of a friction force present between the contact bodies and the second part, wherein the first and the second part are pretensioned relative to one another perpendicularly to the displacement direction, while the contact bodies are displaceable relative to the first part perpendicularly to the displacement direction, and a position of the first and of the second part relative to one another perpendicular to the displacement direction is measurable by means of a sensor which forms part of a feedback control by means of which displacements of the contact bodies perpendicular to the displacement direction are controllable.

2. A displacement device as claimed in claim 1, characterized in that the contact bodies each form part of a separate displacement unit which is provided with a separate actuator system for the stepwise movement of the relevant contact body and for the displacement of the relevant contact body and for the displacement direction.

3. A displacement device as claimed in claim 2, characterized in that the displacement device is provided with at least three displacement units, while the contact bodies are each provided with a contact surface which comprises at least part of a surface of an imaginary circular cylinder, and the displacement units each comprise at least two linear actuators which can be activated in a direction perpendicular to the displacement direction.

4. A displacement device as claimed in claim 3, characterized in that the contact bodies are each fastened to the corresponding displacement unit by means of a membrane which extends parallel to the displacement direction in an imaginary plane which passes through the centerline of the circular cylinder.

5. A displacement device as claimed in claim 2, characterized in that the displacement device is provided with at least three displacement units, while the contact bodies are each provided with a contact surface which comprises at least a portion of a surface of an imaginary sphere, and the displacement units each comprise at least three linear actuators which can be activated perpendicularly to the displacement direction.

6. A displacement device as claimed in claim 5, characterized in that the contact bodies are each fastened to the relevant displacement unit by means of an annular membrane which extends parallel to the displacement direction, the center of said membrane coinciding substantially with the center of the sphere.

7. A displacement device as claimed in claim 5, characterized in that the displacement units are each provided with four linear actuators which can be actuated perpendicularly to the displacement direction and are mutually positioned in a square.

8. A displacement device as claimed in claim 3, characterized in that the linear actuators are laminated piezoelectric actuators.

9. A displacement device as claimed in claim 2, characterized in that the second part comprises a guiding surface, and the first part comprises an object table which is pretensioned relative to the second part in a direction perpendicular to the guiding surface and is displaceable along the guiding surface parallel to a first displacement direction and to a second displacement direction perpendicular to the first displacement direction through cooperation of the contact bodies of the first part with the guiding surface, the first part comprising at least three displacement units for each displacement direction.

10. A displacement device as claimed in claim 5, characterized in that the second part comprises a guiding surface and the first part comprises an object table which is pretensioned relative to the second part in a direction perpendicular to the guiding surface and is displaceable along the guiding surface parallel to a first displacement direction and to a second displacement direction which is perpendicular to the first displacement direction through cooperation of the contact bodies of the first part with the guiding surface, the first part comprising four groups of four displacement units each, which groups are mutually positioned in a quadrangular arrangement, while the displacement units in a group are mutually arranged in a square.

11. A displacement device as claimed in claim 5, characterized in that the first part comprises a bearing bush and the second part comprises a shaft which is provided with a circular-cylindrical guide and which is rotatable and displaceable in axial direction in the bearing bush through cooperation of the contact bodies of the first part with the circular-cylindrical guide, the first part comprising four groups of four displacement units each adjacent a first end of the bearing bush and four further groups of four displacement units each adjacent a second end of the bearing bush, said groups being arranged with regular interspacings in circumferential direction around the bearing bush, while the displacement units within a group are mutually positioned in a square arrangement.

12. A displacement device comprising a first part comprising at least two displacement units, each displacement unit comprising a first pair of contact surfaces interconnected by a first bridge and a second pair of contact surfaces connected by a second bridge, which contact surfaces can be pressed against a second part and are movable stepwise relative to the first part by means of an actuator such that the first and the second part are displaceable relative to one another in a displacement direction under the influence of a friction force present between the contact surfaces and the second part, wherein the first and the second part are pretensioned relative to one another perpendicularly to the displacement direction, while the contact surfaces are displaceable relative to the first part perpendicularly to the displacement direction, and wherein the first and the second bridge are positioned with a mutual interspacing, seen parallel to the displacement direction, and are interconnected by a bending actuator which is bendable about a bending axis which extends perpendicularly to the displacement direction and by a third bridge which is connected to the first and the second bridge via two elastic hinges extending parallel to the bending axis, the contact surfaces of each displacement unit being mutually positioned in a quadrangular arrangement and being each displaceable parallel to the bending axis by means of a separate linear actuator which extends parallel to the bending axis.

13. A displacement device as in claim 12 further comprising a feedback control which controls displacements of the contact surfaces perpendicular to the displacement direction, said feedback control comprising a sensor which measures a position of the first part and the second part relative to one another perpendicular to the displacement direction.

14. A displacement device as in claim 12 wherein the linear actuators are laminated piezoelectric actuators.

15. A displacement device as in claim 12 wherein the second part comprises a guiding surface, and the first part comprises an object table which is pretensioned relative to the second part in a direction perpendicular to the guiding surface and is displaceable along the guiding surface parallel to a first displacement direction and to a second displacement direction perpendicular to the first displacement direction through cooperation of the contact surfaces of the first part with the guiding surface, the first part comprising at last three displacement units for each displacement direction.

16. A displacement device as claimed in claim 12, wherein the contact surfaces of each displacement unit positioned diagonally relative to one another are interconnected by two bridges which are each connected to the relevant contact surfaces positioned diagonally relative to one another via two elastic hinges which extend parallel to the bending axis.

17. A displacement device as claimed in claim 12, wherein the bending actuator is a piezoelectric bending actuator.

18. A displacement device comprising a first part comprising at least two displacement units, each displacement unit comprising a contact body which can be pressed against a second part and an actuator for stepwise movement relative to the second part such that the first and the second part are displaceable relative to one another in a displacement direction under the influence of a friction force present between the contact bodies and the second part, wherein the first and the second part are pretensioned relative to one another perpendicularly to the displacement direction, while the contact bodies are displaceable relative to the first part perpendicularly to the displacement direction, and wherein the first part comprises a bearing bush and the second part comprises a shaft which is provided with a circular-cylindrical guide and which is rotatable and displaceable in axial direction in the bearing bush through cooperation of the contact bodies of the first part with the circular-cylindrical guide, the first part comprising at least three displacement units for the rotation of the second part and at least three further displacement units for the axial displacement of the second part.

19. A displacement device as in claim 18 further comprising a feedback control which controls displacements of the contact surfaces perpendicular to the displacement direction, said feedback control comprising a sensor which measures a position of the first part and the second part relative to one another perpendicular to the displacement direction.

* * * * *